US006768695B2

United States Patent
Kaiser et al.

(10) Patent No.: US 6,768,695 B2
(45) Date of Patent: Jul. 27, 2004

(54) CIRCUIT CONFIGURATION FOR DRIVING A PROGRAMMABLE LINK

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/600,408

(22) Filed: Jun. 20, 2003

(65) Prior Publication Data

US 2004/0037128 A1 Feb. 26, 2004

Related U.S. Application Data

(63) Continuation of application No. PCT/DE01/04787, filed on Dec. 18, 2001.

(30) Foreign Application Priority Data

Dec. 20, 2000 (DE) ......................................... 100 63 685

(51) Int. Cl.[7] .............................................. G11C 7/00
(52) U.S. Cl. .................. 365/225.7; 365/96; 365/230.06
(58) Field of Search .............................. 365/225.7, 96, 365/200, 230.06, 189.05, 189.01; 327/525, 526

(56) References Cited

U.S. PATENT DOCUMENTS

| 5,313,424 | A | | 5/1994 | Adams et al. |
| 5,424,672 | A | | 6/1995 | Cowles et al. |
| 5,442,589 | A | | 8/1995 | Kowalski |
| 5,631,862 | A | | 5/1997 | Cutter et al. |
| 6,163,488 | A | * | 12/2000 | Tanizaki et al. ............. 365/200 |
| 6,288,964 | B1 | * | 9/2001 | Shirley ..................... 365/225.7 |
| 6,400,632 | B1 | * | 6/2002 | Tanizaki et al. ......... 365/225.7 |
| 6,515,934 | B2 | * | 2/2003 | Kobayashi et al. ......... 365/226 |
| 6,545,926 | B2 | * | 4/2003 | Ooishi et al. ............ 365/225.7 |

FOREIGN PATENT DOCUMENTS

FR   2 611 400   9/1988

* cited by examiner

*Primary Examiner*—Gene N. Auduong
(74) *Attorney, Agent, or Firm*—Laurence A. Greenberg; Werner H. Stemer; Gregory L. Mayback

(57) ABSTRACT

A circuit configuration for driving a programmable link, for example a fuse, is specified, having a drive circuit for driving the fuse in a manner dependent on a signal present at the data input, and also a volatile memory, whose output is preferably directly connected to the data input of the drive circuit. A circuit configuration for particularly fast and simple programming of fuses, in particular electrically programmable fuses, is thereby specified.

11 Claims, 1 Drawing Sheet

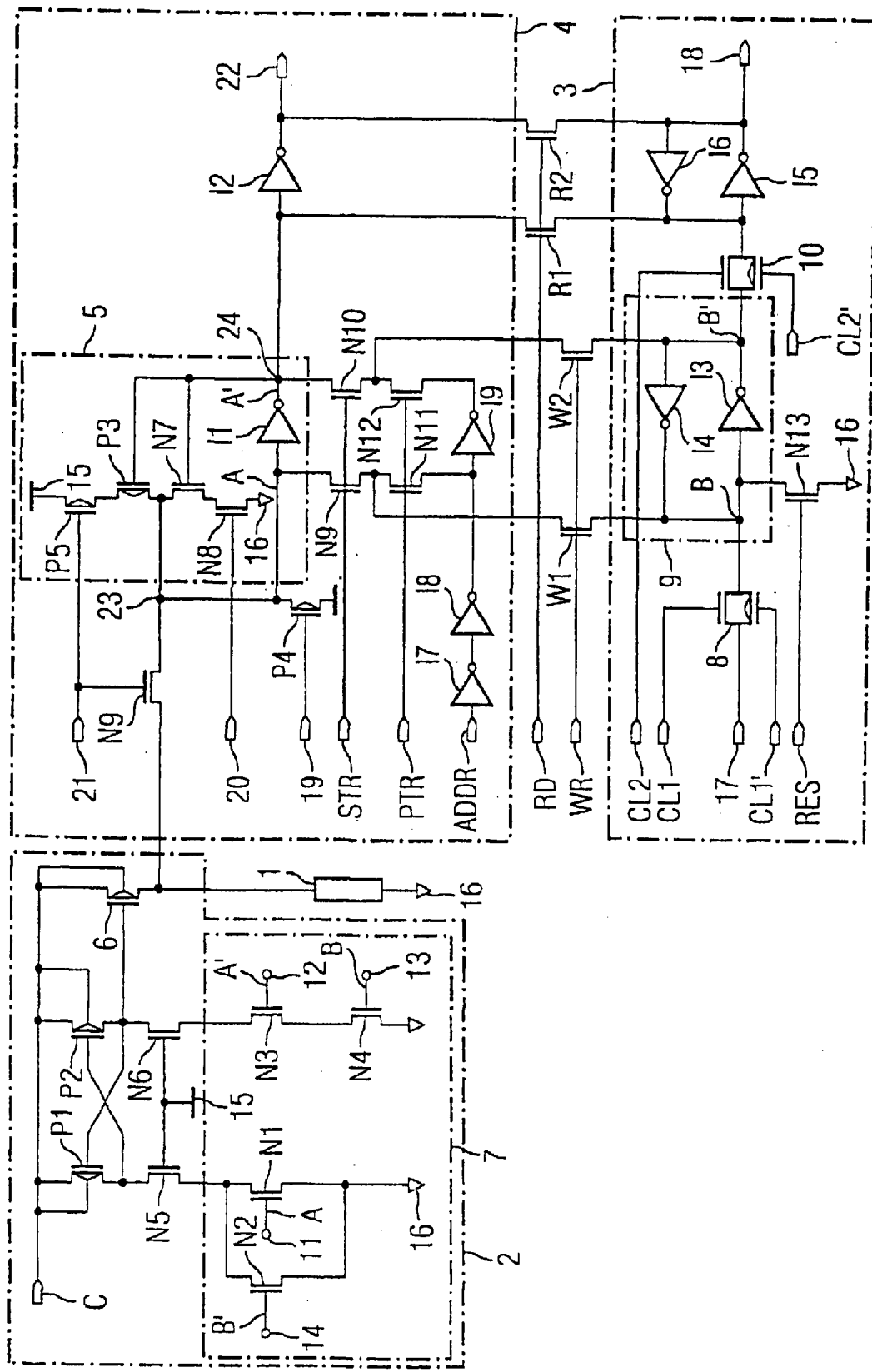

CIRCUIT CONFIGURATION FOR DRIVING A PROGRAMMABLE LINK

CROSS-REFERENCE TO RELATED APPLICATION

This application is a continuation of copending International Application No. PCT/DE01/04787, filed Dec. 18, 2001, which designated the United States and was not published in English.

BACKGROUND OF THE INVENTION

Field of the Invention

The present invention relates to a circuit configuration for driving a programmable link and to a use thereof in a mass memory chip.

In memory chips, for example synchronous dynamic random access memory (SRAMs), having a memory space of 256 megabytes, for example, replacement memory cells that can compensate for production-dictated failures of individual memory cells are usually provided for the purpose of providing redundancy. For this purpose, programmable links, also referred to as fuses, are provided, whose programming enables defective memory cells to be replaced by intact replacement cells. By way of example, a few thousand fuses may be provided in a RAM having a storage capacity of 256 MB.

In order to change over the programmable links from a low-impedance to a high-impedance state or vice versa, the programmable links are permanently changed over in a known manner either by an energy pulse in the form of a laser or by an electrical pulse. The electrical pulse may be, for example, a voltage pulse or a current pulse.

In this case, a distinction is made between fuses, which can be put into a non-conducting (high-impedance) state from a conducting (low-impedance) state by the energy pulse described, and antifuses, which can be changed from a non-conducting state to a conducting state by application of an energy pulse.

This so-called activation or blowing of fuses, which is a one-time, usually irreversible, operation which permanently changes the programmable link from a low-impedance to a high-impedance state or vice versa, has usually been effected hitherto by a laser prior to encapsulation of the memory chips with a housing. However, this is associated with the disadvantage that it is no longer possible to repair defective memory cells after encapsulation of the chips.

When fuses are blown by electrical pulses, it has usually been the case hitherto that a volatile memory in which the information that is to be permanently programmed is stored in a volatile manner is read and then the programmable links to be blown are externally addressed and selected by addresses. This procedure requires a high outlay. Moreover, the principle described takes a comparatively long time.

SUMMARY OF THE INVENTION

It is accordingly an object of the invention to provide a circuit configuration for driving a programmable link that overcomes the above-mentioned disadvantages of the prior art devices of this general type, which permits rapid driving of the programmable link with a low outlay.

With the foregoing and other objects in view there is provided, in accordance with the invention, a circuit configuration. The circuit configuration contains a programmable link for permanent storage of a datum and a drive circuit. The drive circuit has a data input, a complementary data input, a drive circuit output coupled to the programmable link and outputting an energy pulse for activating the programmable link in a manner dependent on a data signal present at the data input, a first transistor having a control terminal connected to the data input, and a second transistor having a control terminal connected to the complementary data input. A volatile memory for storing a datum, is provided. The volatile memory contains an output outputting the data signal being a memory content of the volatile memory. The output is connected to the data input of the drive circuit for data communication, and the control terminal of the first transistor receives the data signal. The volatile memory has a complementary output outputting a complementary data signal being complementary to the data signal and connected to the complementary data input of the drive circuit. Therefore, the control terminal of the second transistor receives the complementary data signal.

The drive circuit provides an energy pulse that is suitable for the programming, activation or blowing of the programmable link. In this case, activation, programming or blowing of the programmable link is understood to be the permanent changeover of the programmable link from a low-impedance to a high-impedance state, or vice versa.

Such programmable links for the permanent storage of a datum, for example a single bit, are usually referred to as a fuse. Fuses that can be activated by an electrical energy pulse are also referred to as an e-fuse. The electrical energy pulse may be, for example, a current or voltage pulse.

In order, in a mass memory chip, for example an SDRAM, to be able to repair faults that occur or have been identified, that is to say defective memory cells, in real time, the volatile memory is required, using which defective memory cells can be replaced by redundant, intact cells by reprogramming. This is usually not possible with programmable links in real time, since programmable links cannot be blown within one clock cycle, which is just 10 ns, for example, given a clock rate of 100 MHz.

Rather, the permanent memory realized by the programmable link is suitable for storing the reprogramming, for example in memory chips. After a system having one or more memory chips has been switched off and switched on again, the already known information about programming with regard to defective memory cells should be able to be effected usually without renewed detection of defective memory cells and replacement thereof by redundant cells.

If an address of a defective memory cell to be replaced contains a plurality of bits, for example 25 bits, then it is possible, if the circuit configuration described is in each case suitable for the volatile and permanent storage of a single bit, to provide a plurality of circuit configurations described.

The principle described enables the direct driving of a programmable link using the drive circuit directly by a datum stored in the volatile memory. This results in a low outlay. Complicated reading from a volatile memory, which is also referred to as a fuse latch, and subsequent addressing of the assigned programmable link can be obviated in this case. Fast blowing or programming of programmable links, in particular in memory chips, is possible overall.

In one preferred embodiment of the invention, the output of the volatile memory is directly connected to the at least one data input of the drive circuit. The direct connection enables, on the one hand, a particularly simple circuit construction and, on the other hand, particularly fast blowing of programmable links.

In a further preferred embodiment of the present invention, the volatile memory contains a memory cell. In this case, the memory cell may be configured for the rapid storage of a datum. The output of the volatile memory, which may be directly connected to the at least one data input of the drive circuit, may be an output of the memory cell.

In a further preferred embodiment of the present invention, the memory cell has two inverters, which are coupled with negative feedback to form a self-latching latch. In this case, a respective input of one inverter may be coupled to an output of another inverter, whose input may be coupled to the output of the first inverter. This results in a self-latching latch. This enables a particularly simple construction of a memory cell, also called a latch, which, moreover, can be read from and written to particularly rapidly.

In a further preferred embodiment of the invention, the drive circuit has an activation input for feeding in an activation signal and a data input for feeding in a data signal. The data input may, as already described, be connected to the output of the volatile memory. In addition, an activation input may be provided, which generally enables a selection of the programmable link connected to the relevant drive circuit.

In a further preferred embodiment of the present invention, the drive circuit has an AND logic circuit, with the data input and the activation input for the AND combination of data signal and activation signal. In this case, an energy pulse is output on the output side of the drive circuit precisely when both data signal and activation signal, given positive circuit logic, in each case communicate a logic one.

In a further preferred embodiment of the present invention, the volatile memory has, in addition to the output, a complementary output, at which can be derived a data signal that is complementary to the data signal that can be derived at the output, and the drive circuit has, in addition to the at least one input, a complementary input connected to the complementary output. Input and complementary input are data inputs in this case. The signal that can be provided at the complementary input may be an inverse data signal. The complementary data signal that can be derived at the complementary output may be an inverse data signal.

In a further advantageous embodiment of the present invention, the complementary input is directly connected to the complementary output. For the transmission of complementary signals, the direct connection of data input and complementary input of the drive circuit to output and complementary output of the memory cell of the volatile memory may enable particularly fast blowing of the programmable link and also a particularly simple circuit construction.

In a further advantageous embodiment of the present invention, the drive circuit contains a blowing transistor, which, on the input side, is coupled to the at least one data input and also to a terminal for feeding in a blowing voltage and, on the output side, is coupled to the programmable link for the purpose of communicating a voltage pulse. The above-described energy pulse for blowing or activating the programmable link may be an electrical pulse, for example a voltage pulse described. The voltage pulse may advantageously be provided by the blowing transistor. By way of example, the above-described AND logic circuit may be connected on the output side to a control terminal of the blowing transistor. One terminal of the controlled path of the blowing transistor may be connected to the terminal for feeding in a blowing voltage and a further terminal of the blowing transistor may be directly connected to the programmable link.

In a further advantageous embodiment of the present invention, the drive circuit has a level boosting circuit, which, on the output side, is connected to an input of the blowing transistor. The level boosting circuit may be connected, by an input, for example to an output of the AND logic circuit. A higher blowing voltage may be provided by the level boosting circuit, if necessary for blowing the programmable link. In this case, the level boosting circuit increases the voltage level present on the input side, and provides a higher voltage level on the output side.

In a further preferred embodiment of the invention, the circuit configuration is constructed using CMOS circuit technology. This enables a particularly space-saving, current-saving and simple circuit construction.

In a further advantageous embodiment of the present invention, the circuit configuration is disposed in a mass memory chip. In this case, the circuit configuration described may be provided as a multiplicity thereof in the mass memory chip. In particular, it is possible to provide as many circuit configurations as there are programmable links. By way of example, 10,000 of the circuit configurations described may be provided in an SDRAM memory chip having a memory space of 512 MB.

Other features which are considered as characteristic for the invention are set forth in the appended claims.

Although the invention is illustrated and described herein as embodied in a circuit configuration for driving a programmable link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a simplified circuit diagram of a first embodiment of a circuit configuration according to the invention.

DESCRIPTION OF THE PREFERRED EMBODIMENTS

Referring now to the single FIGURE of the drawing, there is shown a programmable link 1, which is configured as an antifuse and is connected to a supply voltage terminal 16 by one terminal and to a drive circuit 2 by a further terminal. The drive circuit 2 is connected to a shift register 3 for the feeding in of an activation signal B, B'. Furthermore, a volatile memory 4 is provided, which, on the one hand, is connected to the further terminal of the antifuse 1 for reading out the state thereof and, on the other hand, is connected to the drive circuit 2 for feeding in a data signal A, A' to a data input 11, 12.

The drive circuit 2 contains an AND logic circuit 7, which combines data signal A, A' and activation signal B, B' with one another in a logic AND combination. Two NMOS transistors N1, N2 connected in parallel are provided for this purpose, of which a first NMOS transistor N1 has a control input connected to a data input 11, and a second NMOS transistor N2 has a control input having an activation input 14 for feeding in the activation signal B. Furthermore, further NMOS transistors N3, N4 are provided in the AND logic circuit 7 for feeding in respectively complementary or inverse data and activation signals A', B', which transistors are connected in series by their controlled paths, and of which transistors a first NMOS transistor N3 has a control input connected to a data input 12, for feeding in the complementary data signal A', and a second NMOS transistor N4 has a control input connected to an activation input 13 for feeding in a complementary activation signal B'.

The NMOS transistors N1, N3 with the data input 11, 12 are simultaneously part of a circuit for level boosting which, on the control side, is connected to the blowing transistor 6. The circuit for level boosting, which is part of the drive circuit 2, has two cross-coupled PMOS transistors P1, P2, which are connected to the AND logic circuit 7 via further NMOS transistors N5, N6. On the output side of the circuit for level boosting P1, P2, N5, N6, there is connected the blowing transistor 6 embodied as a PMOS transistor which is connected by a load terminal to the antifuse 1 and also to the volatile memory 4 for reading out the state of the antifuse 1.

The volatile memory 4 contains a memory cell 5 formed from two inverters I1; P3, N7 connected to one another. In this case, a first inverter I1 is provided, at whose input the data signal A can be derived and at whose output a complementary or inverse data signal A' can be derived. A PMOS transistor P3 and an NMOS transistor N7, whose control inputs are connected to one another and to the output of the first inverter I1, form the second inverter, whose output is connected to the input of the first inverter I1. The inverters I1 and P3, N7 thus form, as memory cell, a feedback latch with self-latching.

At the memory cell 5, auxiliary inputs 19, 20, 21 are provided for the purpose of reading out the present state of the antifuse 1. First, with auxiliary input 19 and a PMOS transistor P4 connected thereto by its control input, for reading out the state of the antifuse 1, a logic 1 is written to the memory cell 5 and self-latched there. Afterward, with auxiliary inputs 20, 21, which drive mutually complementary CMOS transistors P5, N8 of the memory cell 5, a tristate state is formed in the memory cell 5, which connects the memory cell 5, in particular the inverter P3, N7, to the supply voltage terminals 15, 16 in a high-impedance manner. An NMOS transistor N9 is conducting at the same time, which transistor is likewise connected to auxiliary input 21 for its control and is connected between a terminal of the antifuse 1 and an input of the memory cell 5. This has the effect that the circuit node at the input of the first inverter I1 in the memory cell 5 remains at high impedance if the antifuse 1 is likewise at high impedance, and undergoes transition to a low-impedance state if the antifuse 1 configured as an antifuse is at low impedance, that is to say already blown. In the latter case, the input node of the first inverter I1, which provides the data signal A, discharges via transistor N9 and the antifuse 1, which is conducting in this case. As soon as the state of the antifuse 1, that is to say whether the antifuse is at low impedance conducting or at high impedance, is read out as logic 0 or 1 into the memory cell 5, the signals applied to the auxiliary inputs 20, 21 for this purpose are removed and the memory cell 5 undergoes transition to self-latching again. By an inverter I2, which is connected to the output of the first inverter I1 by its input, the data signal A or the inverse data signal A' can be read out from memory cell 5 at an output 22. Furthermore, the memory cell 5 is coupled to an address input ADDR, which, on the input side, is connected to three series-connected inverters I7, I8, I9. Furthermore, for coupling the address input ADDR to the memory cell 5, two pairs of NMOS transistors N9, N10; N11, N12 are provided, the control inputs of which are connected to a strobe input STR and to a pointer input PTR. By strobe and pointer signals on the selection lines STR and PTR, a bit of an address of a memory cell of an SDRAM, for example, can be written to the memory cell 5, in which case the memory cell in the SDRAM to which points the address of which one bit can be fed in at the input ADDR may be defective. If the address is defective, then the bit of the relevant defective memory cell address which is present at the address input ADDR can be written to the memory cell 5 by the selection lines STR, PTR, which can be activated for this purpose. Permanent storage of the bit of the address of the defective memory cell cannot be made possible with memory cell 5, however, since the latter only forms a volatile memory. Therefore, the drive circuit 2 described enables the read-out of the memory cell 5, that is to say of the data signal A, A' via the AND control logic 7 already described and also the permanent storage of the datum read out by the blowing transistor 6 in the antifuse 1. In this case, the AND logic circuit 7 combines the data signal A, A' with an activation signal B, B' in an AND combination. Consequently, the antifuse 1 is blown only when both a logic 1 is stored in memory cell 5 and, in addition, a logic 1 is provided by the activation signal B, B' at the activation input 13, 14. Finally, a blowing operation for the antifuse 1 in accordance with the exemplary embodiment also requires a blowing voltage C to be present at the PMOS transistors P1, P2, which form the level boosting circuit already described, and at the blowing transistor 6.

In accordance with the present invention, the activation signal B, B' can then be provided by the shift register 3 in the register cell 9, which likewise has two negative feedback inverters I3, I4 which form a self-latching circuit. A switch 8, 10 embodied as a PMOS transfer gate is respectively connected to the input of the register cell 9 and to the output of the register cell 9. While the switch 8 connected on the input side can be driven by a first clock signal CL1, CL1', the switch 10 disposed on the output side can be driven by means of a second clock signal CL2, CL2', which can be fed to the switch 10. The memory content of the register cell 9 can be reset via an NMOS transistor N13, which connects the input of the register cell 9 to the supply voltage terminal 16, and which is connected to a reset input RES on the control side. On the output side of the register cell 9 and connected downstream of the output-side switch 10, the shift register 3 has a further self-latching circuit, which is realized with two likewise negative feedback inverters I5, I6 and couples the switch 10 to an output 18 of the shift register 3. The input of the shift register 3 that is connected to an input of the input-side switch 8 is designated by 17.

As already described, memory cells in SDRAM chips, which may have a memory space of 256 megabytes, for example, are selected by use of addresses. Such an address may have 25 bits, for example. Accordingly, 25 of the circuits shown in the figure, containing the antifuse 1, the drive circuit 2, the volatile memory 4 and the shift register 3, are necessary for the addressing of an individual memory cell of an SDRAM chip. However, in order to avoid an impermissibly high current flow, which may momentarily amount to approximately 1 mA per antifuse, during the blowing of the antifuses 1, the individual drive circuits 2 for the antifuses 1 with shift register 3 may be selected or addressed successively or partly simultaneously. For this purpose, the plurality of shift registers 3 can be connected to one another in a series circuit, in which case an input 17 of one shift register circuit 3 can respectively be connected to an output 18 of another shift register circuit 3. A shift register chain is formed as a result of this. The register cells 9 respectively connected to one another via switches 8, 10 can also be interpreted as a register. A bit pattern generator, not depicted in the present figure, may be connected to the input of the first register cell. If only one antifuse is permitted to be blown at any one time, then a bit sequence which has only one logic 1 and is filled with zeros can be provided by the bit pattern generator at the input of the shift register chain. The logic 1 is then successively shifted through all the register cells 9 of the shift register, so that only one drive circuit 2 is activated at that time in each case by the respective activation signal B. The clock signals CL1, CL1' and CL2, CL2' are provided for controlling the sequence. If a plurality of antifuses 1 can be blown simultaneously, then it is also possible, of course, by the shift register 3, for a plurality of directly successive ones or ones spaced apart by zeros at an adjustable interval to be shifted through the shift register chain.

The circuit configuration described, with the fast volatile memory 4, enables a correction of defective memory cells in a mass memory chip in real time. By way of example, before the mass memory chip is switched off, the respective addresses of the defective memory cell can be written permanently, for which purpose the drive circuits 2 and the antifuse 1 are provided. Consequently, blowing of antifuses 1 for the permanent storage of defective addresses, more precisely addresses of defective memory cells, is made possible. This is still possible even after the encapsulation and housing of the mass memory chip, since the antifuse 1 is electrically driveable. Finally, the invention affords the advantage that not only can an impermissibly high blowing current occur as a result of the simultaneous blowing of too many antifuses, but that in addition an arbitrary number of antifuses 1 can be blown simultaneously and in an arbitrary order by bit patterns that can be generated arbitrarily and can be shifted through the register cells 9.

Furthermore, the control terminals of two read transistors R1, R2 are connected to a read input RD. In this case, the controlled path of the first read transistor R1 couples the input of the further memory cell I5, I6 of the shift register 3 to the input of the second inverter I2 at the output of the memory cell 5. The second read transistor R2, by its controlled path, couples the output of the further memory cell I5, I6 of the shift register 3 to the output of the second inverter I2 and thus to the output 22 of the volatile memory 4. Consequently, upon activation of the read line at the read input RD, the data stored in the memory cell 5 or the bit stored in memory cell 5 can be read out and written to the latch I5, I6, operated with self-latching, in a simple manner. For data transfer in the opposite direction, a respective control input of a respective first and second write transistor W1, W2, configured as NMOS transistors in the same way as the read transistors R1, R2, is connected to a write input WR. In this case, the controlled path of the first write transistor W1 couples the input of the register cell 9 to an input of the memory cell 5 and the second write transistor W2, by its controlled path, couples the output of the register cell 9 of the shift register 3 to an input of the memory cell 5 in the volatile memory 4.

The write and read transistors described bring about, in a simple manner, a coupling for bi-directional data transfer between the memory cell 5 and the register cell 9, that is to say between the volatile memory 4 and the shift register 3. Consequently, in conjunction with a particularly low area requirement, the shift register 3 fulfils a dual function. On the one hand, the memory cell 5 can be read from and written to simply and rapidly, and, on the other hand, an information item for activating the blowing transistor 6 for blowing the programmable link 1 configured as an antifuse can be communicated by the shift register.

We claim:

1. A circuit configuration, comprising:
   a programmable link for permanent storage of a datum;
   a drive circuit containing:
      a data input;
      a complementary data input;
      a drive circuit output coupled to said programmable link and outputting an energy pulse for activating said programmable link in a manner dependent on a data signal present at said data input;
      a first transistor having a control terminal connected to said data input;
      a second transistor having a control terminal connected to said complementary data input; and
   a volatile memory for storing a datum, said volatile memory containing:
      an output outputting the data signal being a memory content of said volatile memory, said output connected to said data input of said drive circuit for data communication, said control terminal of said first transistor receiving the data signal; and
      a complementary output outputting a complementary data signal being complementary to the data signal and connected to said complementary data input of said drive circuit, said control terminal of said second transistor receiving the complementary data signal.

2. The circuit configuration according to claim 1, wherein said output of said volatile memory is directly connected to said data input of said drive circuit.

3. The circuit configuration according to claim 1, wherein said volatile memory has a memory cell.

4. The circuit configuration according to claim 3, wherein said memory cell has two inverters which are coupled with negative feedback to form a self-latching circuit.

5. The circuit configuration according to claim 1, wherein said drive circuit has an activation input for receiving an activation signal.

6. The circuit configuration according to claim 5, wherein said drive circuit has an AND logic circuit, said data input and said activation input being inputs for said AND logic circuit for performing an AND combination of the data signal and the activation signal.

7. The circuit configuration according to claim 1, wherein said complementary data input is directly connected to said complementary output of volatile memory.

8. The circuit configuration according to claim 1, wherein said drive circuit contains a blowing transistor having an input side coupled to said data input, a terminal for receiving a blowing voltage and, an output side coupled to said programmable link for transmitting a voltage pulse.

9. The circuit configuration according to claim 8, wherein said drive circuit has a level boosting circuit (P1, P2, N1, N3, N5, N6) with an output side connected to said input side of said blowing transistor.

10. The circuit configuration according to claim 1, wherein the circuit configuration is constructed using CMOS circuit technology.

11. A mass memory chip, comprising:
    a circuit configuration, including:
       a programmable link for permanent storage of a datum;
       a drive circuit containing:
          a data input;
          a complementary data input;

a drive circuit output coupled to said programmable link and outputting an energy pulse for activating said programmable link in a manner dependent on a data signal present at said data input;

a first transistor having a control terminal connected to said data input;

a second transistor having a control terminal connected to said complementary data input; and a volatile memory for storing a datum, said volatile memory containing:

an output outputting the data signal being a memory content of said volatile memory, said output connected to said data input of said drive circuit for data communication, said control terminal of said first transistor receiving the data signal; and a complementary output outputting a complementary data signal being complementary to the data signal and connected to said complementary data input of said drive circuit, said control terminal of said second transistor receiving the complementary data signal.

* * * * *